US008315793B2

(12) United States Patent
Withanawasam

(10) Patent No.: US 8,315,793 B2
(45) Date of Patent: Nov. 20, 2012

(54) INTEGRATED MICRO-ELECTRO-MECHANICAL SYSTEMS (MEMS) SENSOR DEVICE

(75) Inventor: Lakshman Withanawasam, Maple Grove, MN (US)

(73) Assignee: Honeywell International Inc., Morristown, NJ (US)

( * ) Notice: Subject to any disclaimer, the term of this patent is extended or adjusted under 35 U.S.C. 154(b) by 299 days.

(21) Appl. No.: 12/477,667

(22) Filed: Jun. 3, 2009

(65) Prior Publication Data

US 2010/0312468 A1 Dec. 9, 2010

(51) Int. Cl.
*G01P 15/00* (2006.01)
*G01C 9/00* (2006.01)
*G01C 21/10* (2006.01)

(52) U.S. Cl. .......... 701/400; 701/500; 702/150; 73/488; 73/514.01

(58) Field of Classification Search .................. 701/200, 701/207, 220; 73/488, 504.02, 514.01; 702/150, 702/151, 158
See application file for complete search history.

(56) References Cited

U.S. PATENT DOCUMENTS

| 5,820,924 | A | 10/1998 | Witcraft et al. |
| 6,528,344 | B2 | 3/2003 | Kang |
| 6,674,159 | B1 * | 1/2004 | Peterson et al. ............... 257/680 |
| 6,979,872 | B2 | 12/2005 | Borwick, III et al. |
| 7,104,129 | B2 | 9/2006 | Nasiri et al. |
| 7,402,449 | B2 * | 7/2008 | Fukuda et al. .................. 438/53 |
| 2004/0227201 | A1 | 11/2004 | Borwick, III et al. |
| 2005/0227401 | A1 * | 10/2005 | Lee et al. ......................... 438/51 |
| 2008/0284611 | A1 * | 11/2008 | Leedy ......................... 340/815.4 |
| 2009/0212407 | A1 * | 8/2009 | Foster et al. .................. 257/686 |
| 2010/0230795 | A1 * | 9/2010 | Kriman et al. ................ 257/686 |
| 2010/0242603 | A1 * | 9/2010 | Miller et al. ............... 73/514.32 |
| 2011/0171946 | A1 * | 7/2011 | Soehren ......................... 455/418 |

OTHER PUBLICATIONS

"Standardized MEMS Manufacturing Process", "available at http://www.micralyne.com", Sep. 19, 2007, Publisher: Micralyne.

* cited by examiner

*Primary Examiner* — Sarah B McPartlin
(74) *Attorney, Agent, or Firm* — Fogg & Powers LLC

(57) ABSTRACT

An integrated sensor device is provided. The integrated sensor device comprises a first substrate including a surface portion and a second substrate coupled to the surface portion of the first substrate in a stacked configuration, wherein a cavity is defined between the first substrate and the second substrate. The integrated sensor device also comprises one or more micro-electro-mechanical systems (MEMS) sensors located at least partially in the first substrate, wherein the MEMS sensor communicates with the cavity. The integrated sensor device further comprises one or more additional sensors.

20 Claims, 5 Drawing Sheets

INTEGRATED MICRO-ELECTRO-MECHANICAL SYSTEMS (MEMS) SENSOR DEVICE

BACKGROUND

Mobile devices such as personal navigation devices (PND) and smart phones typically have some form of navigation and map orientation application. These mobile devices often utilize a magnetic compass that have to work even when the device is not held level, which requires a micro-electro-mechanical systems (MEMS) accelerometer or a gyroscope to be integrated with the magnetic sensors. The typical mobile device includes a magnetic compass sensor as well as a separate MEMS accelerometer or a gyroscope sensor. However, including these sensors as two separate sensor devices in a mobile device takes a large printed circuit board (PCB) footprint. Because the mobile navigation devices are very sensitive to cost and size, any solution that reduces cost or the printed circuit board (PCB) footprint of the compass hardware is desired.

SUMMARY

One embodiment of the present invention provides an integrated sensor device. The integrated sensor device comprises a first substrate including a surface portion and a second substrate coupled to the surface portion of the first substrate in a stacked configuration, wherein a cavity is defined between the first substrate and the second substrate. The integrated sensor device also comprises one or more micro-electro-mechanical systems (MEMS) sensors located at least partially in the first substrate, wherein the MEMS sensor communicates with the cavity. The integrated sensor device further comprises one or more additional sensors.

DRAWINGS

Features of the present invention will become apparent to those skilled in the art from the following description with reference to the drawings. Understanding that the drawings depict only typical embodiments of the invention and are not therefore to be considered limiting in scope, the invention will be described with additional specificity and detail through the use of the accompanying drawings, in which.

DETAILED DESCRIPTION

In the following detailed description, embodiments are described in sufficient detail to enable those skilled in the art to practice the invention. It is to be understood that other embodiments may be utilized without departing from the scope of the present invention. The following detailed description is, therefore, not to be taken as limiting.

The embodiments described hereafter relate to integrated micro-electro-mechanical systems (MEMS) sensor devices that include a MEMS sensor and at least one additional sensor, such as a magnetic sensor. Typically, MEMS sensors are capped with a substrate to create a cavity needed for the accelerometer to function and are encompassed in plastic molded packages. Portions of the MEMS substrate and the cap substrate are often left unused. In one embodiment of the present invention, a MEMS sensor and a magnetic sensor are integrated into a single stacked configuration. In one implementation, the electrically unused (blank) semiconductor area of a cap of a MEMS sensor is utilized to host one or more additional sensors in a stacked configuration to form an integrated sensor device.

The present integrated MEMS sensor devices are miniature sensor devices that reduce the amount of semiconductor substrate material used in the device and concurrently reduce the PCB footprint of the packaged device. Integrating an accelerometer (also referred to herein as a tilt sensor) or a gyroscope and magnetic sensors into a common semiconductor device reduces the size taken up by the sensors compared to when the sensors are formed in individual semiconductor chips. For example, a magnetic sensor die and a tilt sensor die can be stacked together to reduce the package size and thereby the package footprint. Since the already available substrate area is used more fully in the present embodiments, fabrication costs will also be lower.

Figure 1:
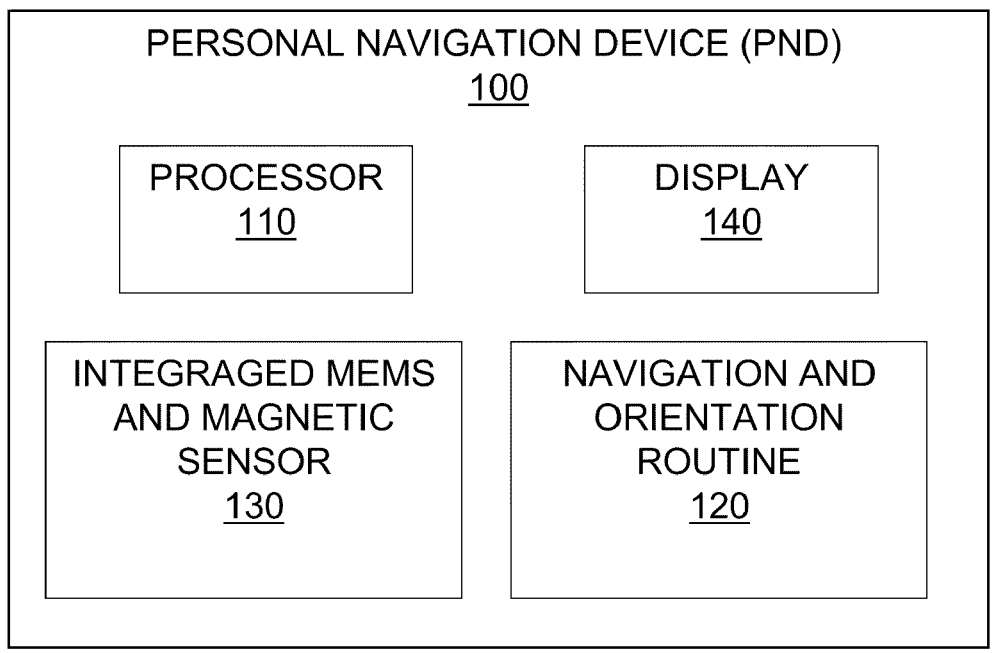
FIG. 1 is one embodiment of a personal navigation device (PND) comprising an integrated MEMS and magnetic sensor.

FIG. 1 is one embodiment of a personal navigation device (PND) 100 comprising an integrated MEMS and magnetic sensor 130. The PND 100 can be a mobile (hand-held) navigation device, a smart phone, or any similar mobile device configured to aid a user in navigation and applications requiring orientation information. For example, a user can be a professional first responder or a member of the public. The PND 100 includes a processor 110 configured to run a navigation and orientation routine module 120. A display 140 presents navigation information to the user, and can comprise a liquid crystal display (LCD), a digital display, or the like. Navigation information that can be displayed includes positional information, orientation information, maps, compass directions, a predetermined path, or any other information useful in navigation.

Orientation information is information relating to the present orientation of the PND 100, and can be determined using the integrated MEMS and magnetic sensor 130 (also referred to herein as the integrated MEMS sensor). The integrated MEMS and magnetic sensor 130 provides information to the processor 110 relating to acceleration, roll, and directional data (that is, relating to a compass direction). The PND 100 can use three axes of sensing for acceleration and gyroscope data in one single integrated MEMS sensor 130. In alternative embodiments, the PND 100 comprises a plurality of integrated MEMS sensors 130, each for a different axis of acceleration or gyroscope data. The components of the PND 100 are communicatively coupled to one another as needed using suitable interfaces and interconnects.

Figure 2A:
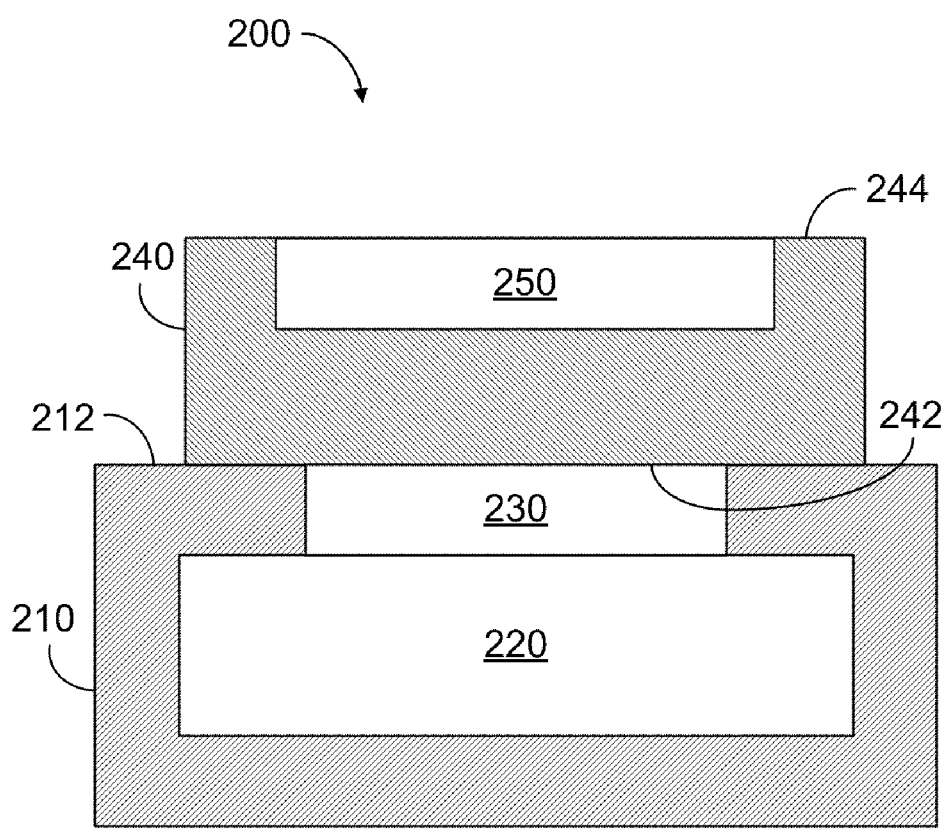
FIGS. 2A-2C are cross-sectional side views of alternative embodiments of a stacked MEMS sensor device.
Figure 2C:
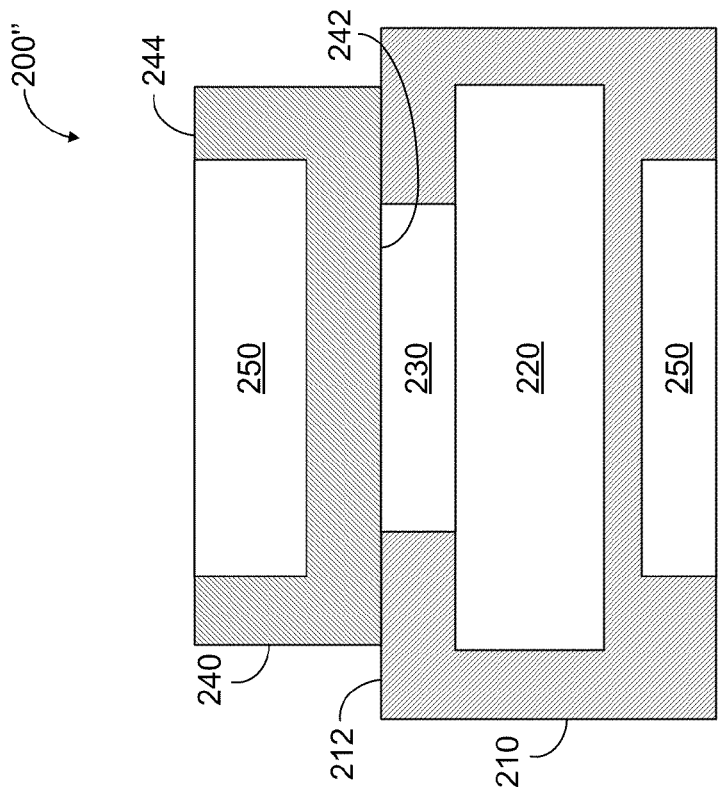
Figure 2B:
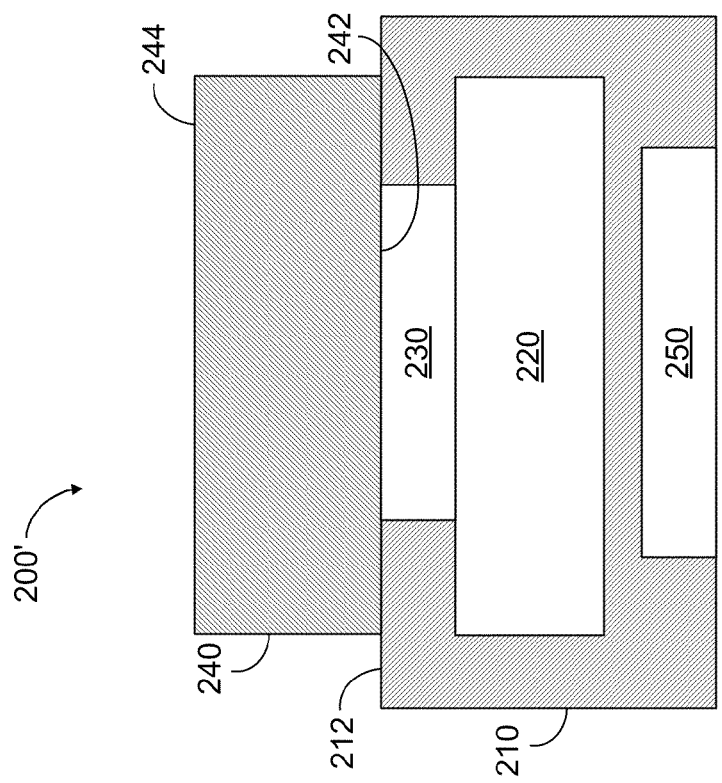

FIGS. 2A-2C illustrate alternative embodiments of a stacked sensor device 200, 200', and 200". The integrated MEMS sensor devices 200, 200', and 200" comprise a first substrate 210 including a surface portion 212. The first substrate 210 contains at least one MEMS sensor 220. A second substrate 240 is coupled to surface portion 212 of the first substrate 210. In some embodiments, portions of the MEMS sensor 220 are located in the second substrate 240. The sensor devices 200, 200', and 200" comprise at least one additional sensor 250 such as a magnetic sensor.

The first and second substrates 210, 240 can be composed of various materials such as silicon, glass, quartz, or the like. In one embodiment, the second substrate 240 is a cap used to cover the MEMS sensor 220. The cap can be sealingly attached to surface portion 212 of substrate 210 using a known bonding process such as glass fritz bonding, gluing, or welding.

The MEMS sensor 220 can include one or more accelerometers, gyroscopes, or combinations thereof, as well as flow sensors, gas detectors, or any other sensor suitable for MEMS technology that has an electrically unused portion in at least one of the substrate 210 or the cap 240. For example, three accelerometer axes can be employed in a single sensor device 200. Similarly, two gyroscope axes can be employed in a single sensor device 200. In one embodiment, the MEMS sensor 220 includes a tilt sensor die.

The integrated sensor devices 200, 200', and 200" further comprise a cavity 230, which is formed between the first substrate 210 and the second substrate 240. The second substrate 240 acts as a cap that protects the MEMS sensor 220 from the external environment and seals the cavity 230. The MEMS sensor 220 is in communication with the cavity 230. As shown in FIGS. 2A-2C the cavity 230 is formed through the surface portion 212 of the substrate 210. However, in alternative embodiments, the cavity 230 is formed in a bottom portion 242 of the second substrate 240. The cavity 230 is sealed to hold either a vacuum or an inert gas. The cavity 230 is used to provide freedom of movement to the MEMS sensor 220, enabling movements such as vibration and rotation.

Figure 2D:
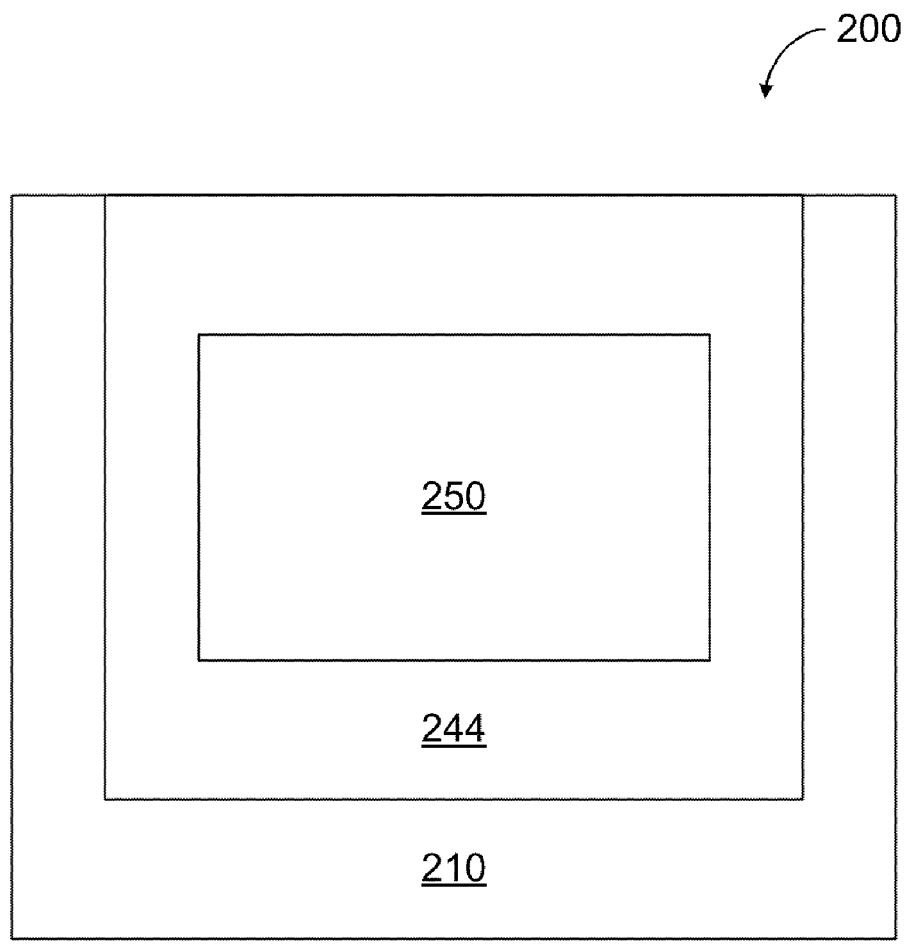
FIG. 2D is top view of the stacked MEMS sensor device of FIG. 2A.

The second substrate 240 (that is, the cap) comprises the bottom portion 242 and a top portion 244. In MEMS devices, the cap (and parts of the first substrate 210) typically includes electrically unused (that is, blank) portions on the top portion 244. A blank portion of a substrate any portion that is not used electrically by the MEMS sensor 220. FIG. 2A illustrates an embodiment where the one or more sensors 250 are located in the second substrate 240. This embodiment of the sensor device 200 provides that part or all of the electrically unused portion of the top portion 244 host one or more sensors 250. The sensors 250 can include a magnetic sensor, a pressure sensor, a temperature sensor, or any type of suitable electronic circuitry. In alternative embodiments, the cap further comprises active MEMS sensor elements or forms part of the overall integrated MEMS sensor device 200. FIG. 2D is a top view of the stacked MEMS sensor device 200 of FIG. 2A, showing the one or more additional sensors 250 in the top portion 244 of the second substrate 240.

As shown in the embodiment of FIG. 2B, one or more additional sensors 250 are located in electrically unused portions of the first substrate 210 of the MEMS sensor device 200'. As depicted in the embodiment of FIG. 2C, one or more additional sensors 250 are located in electrically unused portions of the first substrate 210 and the second substrate 240 of the MEMS sensor device 200".

In the embodiment of FIGS. 2A-2D, the MEMS sensor 220 and the sensors 250 are electrically isolated. In alternative embodiments, the MEMS sensor 220 and the sensors 250 are not electrically isolated. Leads from each sensor may extend out of their respective substrates. Embodiments of the sensor devices 200, 200', and 200" also comprise a metal or substrate frame (not shown) that enables outputs from the sensors 220 and 250 to be connected to other devices (for example, via wires or leads). The sensor devices 200, 200', and 200" also comprise packaging (such as plastic molded packages) for assembly to a next level of a device (such as in the PND 100). Packaging makes the sensor devices 200, 200', and 200" easier to handle and more robust.

Figure 3:
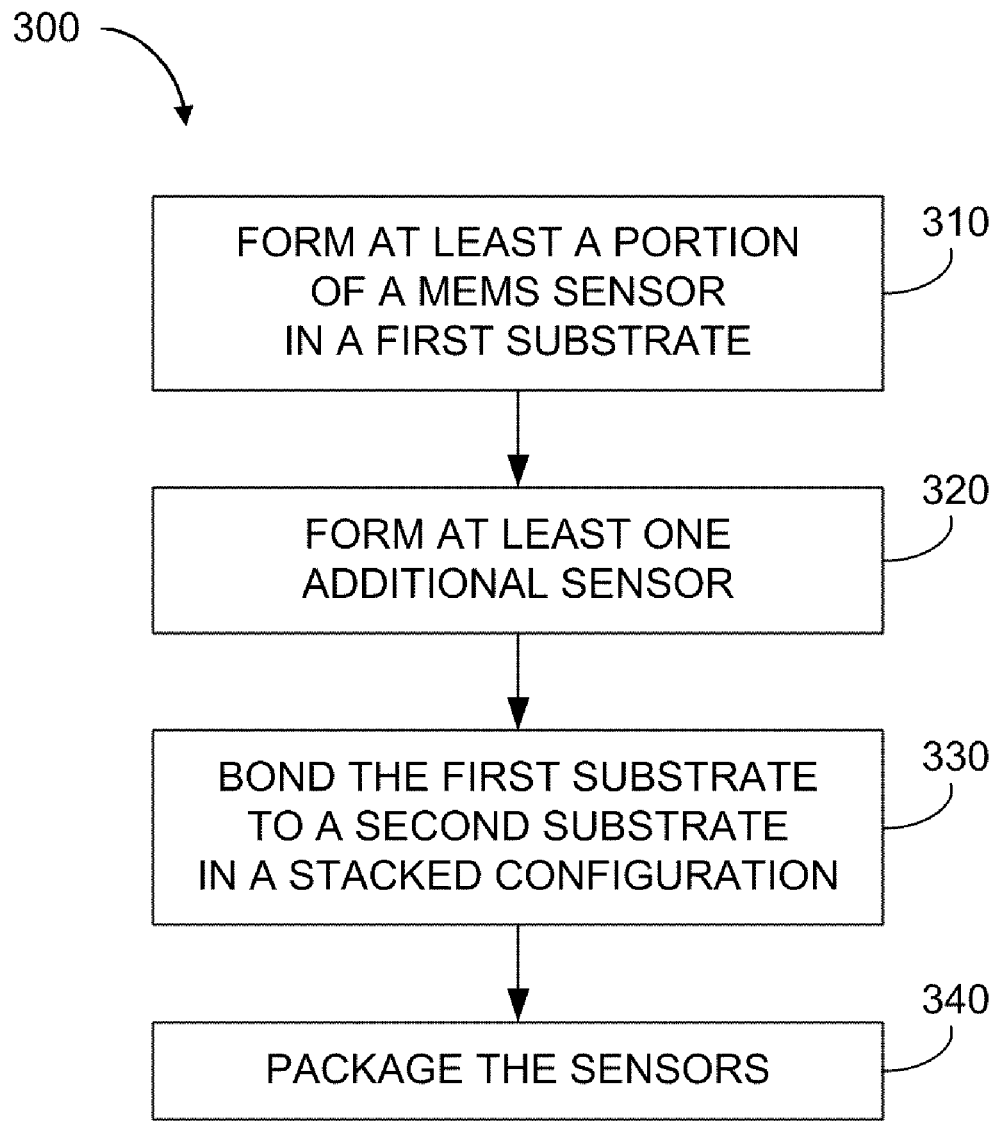
FIG. 3 is a flowchart of one embodiment of a method of forming an integrated MEMS sensor device.

FIG. 3 is a flowchart of one embodiment of a method 300 of integrating a sensor with a MEMS device. At least a portion of a MEMS sensor is formed in a first substrate (310). If the MEMS sensor is not formed entirely in the first substrate, the rest is formed in a second substrate. One exemplary method of fabricating a MEMS active wafer is the Micragem standard. The Micragem standard comprises first etching cavities in a glass wafer. Then electrodes, lines, and bond pads are patterned. A silicon on insulator (SOI) handle wafer is anodically bonded to the glass wafer. The silicon handle wafer and a buried oxide layer are etched. Next, a low stress metal is deposited. Lithographically pattern and deep reactive ion etch (DRIE) is performed to release silicon microstructures. The MEMS sensor elements are formed. However, the Micragem standard is just one exemplary method, and other suitable methods of forming a MEMS sensor known to those of skill in the art are contemplated.

Once the MEMS sensor is formed (310), one or more sensors or electrical circuits are formed. These additional sensors can be fabricated on or in the blank portions of the first substrate, a second substrate (for example, the MEMS cap wafer), or combinations thereof (320). The method of fabricating the sensors onto the cap wafer will depend on the particular sensor being made. For an exemplary process of fabricating magnetic sensors for providing compass data, see U.S. Pat. No. 5,820,924, filed on Jun. 6, 1997, entitled "Method of Fabricating a Magnetoresistive Sensor," which is incorporated by reference herein.

Once all the sensors are fabricated, the second substrate (cap wafer) is bonded to the first substrate using existing mechanical processes (330). This creates the integrated MEMS and sensor stack, which is then packaged to yield the miniature sensor device (340).

In one embodiment, a single device package comprises integrated magnetic and tilt sensors. The electrically unused silicon surface of a tilt sensor die is used as a magnetic sensor die. The magnetic sensor die and the tilt sensor die are stacked together to reduce the package size and thereby the footprint of the device. Since the silicon area is reused, the cost and the footprint both will be reduced. This combined tilt sensor and magnetic sensor can be used to provide position and orientation data in a PND.

The present invention may be embodied in other specific forms without departing from its essential characteristics. Aspects and limitations described in a specific embodiment are combinable with other embodiments. The described embodiments are to be considered in all respects only as illustrative and not restrictive. The scope of the invention is therefore indicated by the appended claims rather than by the foregoing description. All changes that come within the meaning and range of equivalency of the claims are to be embraced within their scope.

What is claimed is:

1. An integrated sensor device, comprising:
   a first substrate including a surface portion;
   a second substrate coupled to the surface portion of the first substrate in a stacked configuration, wherein the second substrate includes a cap to seal a cavity defined between the first substrate and the second substrate;
   one or more micro-electro-mechanical systems (MEMS) sensors located at least partially in the first substrate, wherein the MEMS sensor communicates with the cavity; and
   one or more additional sensors fabricated in the second substrate.

2. The sensor device of claim 1, wherein the first substrate and the second substrate comprise silicon, glass, or quartz.

3. The sensor device of claim 1, wherein the cavity contains a vacuum or an inert gas.

4. The sensor device of claim 1, wherein the one or more MEMS sensors comprise an accelerometer, a gyroscope, a flow sensor, a gas detector, or combinations thereof.

5. The sensor device of claim 1, wherein the one or more additional sensors comprise a magnetic sensor, a pressure sensor, or combinations thereof.

6. The sensor device of claim 1, wherein:
the one or more MEMS sensors is configured to provide acceleration data; and
the one or more additional sensors is at least one magnetic sensor configured to provide directional data.

7. The sensor device of claim 1, wherein the one or more MEMS sensors and the one or more additional sensors are electrically isolated from each other.

8. The sensor device of claim 1, wherein the one or more additional sensors are located in a top portion of the second substrate.

9. A method of forming an integrated sensor device, the method comprising:
fabricating at least a portion of a micro-electro-mechanical systems (MEMS) sensor in a first substrate;
fabricating at least one additional sensor in a second substrate; and
bonding the first substrate to the second substrate in a stacked configuration, wherein the second substrate acts as a cap that seals a cavity defined between the first substrate and the second substrate, and the MEMS sensor communicates with the cavity.

10. The method of claim 9, further comprising packaging the first substrate and the second substrate.

11. The method of claim 9, wherein forming at least one additional sensor further comprises forming the at least one additional sensor in a top portion of the first substrate.

12. The method of claim 9, wherein the MEMS sensor comprises an accelerometer, a gyroscope, or combinations thereof.

13. The method of claim 9, wherein the at least one additional sensor comprises a magnetic sensor.

14. The method of claim 9, wherein the cavity contains a vacuum or an inert gas.

15. A navigation device, comprising:
an integrated sensor device, comprising:
a first substrate including a surface portion;
a second substrate coupled to the surface portion of the first substrate in a stacked configuration, wherein the second substrate includes a cap that seals a cavity defined between the first substrate and the second substrate;
one or more micro-electro-mechanical systems (MEMS) sensors located at least partially in the first substrate, wherein the one or more MEMS sensors communicates with the cavity; and
one or more additional sensors fabricated in the second substrate;
a processor operatively coupled to the integrated sensor device; and
a navigation module run by the processor, wherein the navigation module is configured to determine orientation information based on data from the integrated sensor device.

16. The navigation device of claim 15, further comprising a display configured to present the positional information to a user.

17. The navigation device of claim 15, wherein the navigation device comprises a personal navigation device (PND) or a smart phone.

18. The navigation device of claim 15, wherein the one or more MEMS sensors comprise an accelerometer, a gyroscope, a flow sensor, a gas detector, or combinations thereof.

19. The navigation device of claim 15, wherein the one or more additional sensors comprise a magnetic sensor, a pressure sensor, or combinations thereof.

20. The navigation device of claim 15, wherein the one or more additional sensors are formed on a top portion of the second substrate.

* * * * *